United States Patent
Kamineni et al.

(10) Patent No.: US 10,134,633 B1
(45) Date of Patent: Nov. 20, 2018

(54) SELF-ALIGNED CONTACT WITH CMP STOP LAYER

(71) Applicant: GLOBALFOUNDRIES INC., Grand Cayman (KY)

(72) Inventors: Vimal Kamineni, Mechanicville, NY (US); Stan Tsai, Clifton Park, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/791,658

(22) Filed: Oct. 24, 2017

(51) Int. Cl.
| | |
|---|---|
| *H01L 21/8234* | (2006.01) |
| *H01L 21/768* | (2006.01) |
| *H01L 21/321* | (2006.01) |
| *H01L 21/3213* | (2006.01) |
| *H01L 21/4757* | (2006.01) |
| *H01L 21/3105* | (2006.01) |
| *H01L 29/66* | (2006.01) |
| *H01L 29/417* | (2006.01) |

(52) U.S. Cl.
CPC .. *H01L 21/76897* (2013.01); *H01L 21/31053* (2013.01); *H01L 21/3212* (2013.01); *H01L 21/32133* (2013.01); *H01L 21/47573* (2013.01); *H01L 21/76819* (2013.01); *H01L 21/76838* (2013.01); *H01L 21/76885* (2013.01); *H01L 21/823431* (2013.01); *H01L 29/41775* (2013.01); *H01L 29/66795* (2013.01)

(58) Field of Classification Search
CPC ......... H01L 21/31053; H01L 21/32133; H01L 21/47573; H01L 21/76819; H01L 21/76897; H01L 21/823431; H01L 21/823475; H01L 29/41775; H01L 29/41791; H01L 29/66795; H01L 29/785; H01L 29/7851
See application file for complete search history.

(56) References Cited

U.S. PATENT DOCUMENTS

| | | | |
|---|---|---|---|
| 9,129,986 B2* | 9/2015 | Zang | H01L 29/66545 |
| 9,893,062 B2* | 2/2018 | Shen | H01L 21/823475 |
| 2015/0340467 A1* | 11/2015 | Bouche | H01L 29/66795 |
| | | | 257/401 |
| 2016/0049427 A1* | 2/2016 | Zang | H01L 27/1211 |
| | | | 257/347 |
| 2017/0040179 A1* | 2/2017 | Liao | H01L 21/283 |
| 2017/0047253 A1* | 2/2017 | Park | H01L 21/76897 |
| 2018/0012887 A1* | 1/2018 | Labonte | H01L 21/31053 |

* cited by examiner

*Primary Examiner* — Stephen W Smoot
(74) *Attorney, Agent, or Firm* — Scully Scott Murphy and Presser; Frank Digiglio

(57) ABSTRACT

In a self-aligned contact (SAC) process, a sacrificial etch stop layer is embedded over source/drain regions, i.e., directly over an interlayer dielectric (IDL) disposed over source/drain regions to enable polishing of a nitride capping layer with respect to the interlayer dielectric. The sacrificial etch stop layer may comprise cobalt metal, and is adapted to be removed and replaced with additional ILD material after controlled polishing of the nitride capping layer.

18 Claims, 15 Drawing Sheets

SELF-ALIGNED CONTACT WITH CMP STOP LAYER

BACKGROUND

The present application relates generally to the manufacture of semiconductor devices, and more specifically to a process for manufacturing self-aligned contacts.

Metal-oxide-semiconductor (MOS) transistors, such as MOS field effect transistors (MOSFETs), are used in the manufacture of integrated circuits. MOS transistors typically include gate dielectric and gate conductor layers, spacers, and diffusion regions such as source/drain regions. An interlayer dielectric (ILD) is commonly formed over the transistor structures and covers the diffusion regions.

Separate electrical connections are made to the gate, source, and drain using contact plugs that are typically formed of a metal such as tungsten. The contact plugs are commonly fabricated by initially patterning the ILD layer to form vias. Metal is deposited into the vias to form the contact plugs.

With advanced process nodes, manufacturing windows demand precise critical dimension (CD) control and alignment precision. Misaligned conductive elements, for example, can create short circuits, such as a contact-to-gate short, which adversely affect yield and performance.

Self-aligned contact processes can be used to control feature registration and critical dimension (CD). In various processes, a nitride capping layer is inlaid over gate contacts and a polishing step is used to remove the overburden and expose adjacent trench locations used to form source/drain contacts. As will be appreciated, however, the absence of an etch-selective stopping layer may result in under- or over-polishing of the nitride capping layer.

A comparative, post-replacement metal gate (RMG) architecture is shown in FIG. 1. Gate structures 20, which include a gate dielectric layer 21, work function metal 22 and fill metal 24, are formed over a semiconductor fin 12, and are laterally spaced from source drain regions 14 and interlayer dielectric 40 by sidewall spacer layers 30. After forming nitride capping layer 60, and referring also to FIG. 2, a polishing step is used to remove excess nitride 60 and expose the ILD oxide 40.

Due to poor etch selectivity between the nitride capping layer 60 and the ILD oxide 40, however, it is challenging to control the final (polished) thickness of the nitride capping layer 60. Both under-polishing and over-polishing can create undesired results. In an under-polished condition, for instance, nitride material remaining over the ILD oxide 40 may block etching of the ILD oxide during a subsequent etching step, resulting in an incomplete or absent source/drain contact and an electrical open. Over-polishing of the nitride capping layer 60, on the other hand, may result in insufficient nitride material over the gate structure 20, resulting in an electrical short between gate and source/drain contacts.

SUMMARY

In view of the foregoing, it would be beneficial to develop a self-aligned contact (SAC) process that provides improved control of the polished thickness of the nitride capping layer 60. According to various embodiments, a sacrificial etch selective layer is incorporated into the structure, i.e., within the source/drain contact areas, to provide a stopping layer for polishing of the nitride capping layer. The etch selective layer may include a liner and a fill layer.

In accordance with various embodiments, a method of forming a device includes forming a source/drain region on a semiconductor fin, forming a first interlayer dielectric over the source/drain region, and forming a gate structure over a channel region of the fin. The gate structure, which includes a gate dielectric formed directly over the channel region and a gate conductor formed over the gate dielectric, is laterally spaced from the first interlayer dielectric and the source/drain region by a sidewall spacer.

The method further includes etching at least the first interlayer dielectric selectively with respect to the gate conductor to form a first recessed region, and forming an etch stop layer within the first recessed region. The gate conductor is then etched selectively with respect to the etch stop layer to form a second recessed region. A dielectric layer is formed over the etch stop layer and within the second recessed region. A polishing step is used to remove the dielectric layer overburden and expose the etch stop layer.

The etch stop layer is then removed to form a third recessed region, and a second interlayer dielectric is formed within the third recessed region and directly over the first interlayer dielectric.

According to further embodiments, a method of fabricating a device includes forming a source/drain region on a semiconductor fin, forming a first interlayer dielectric over the source/drain region, and forming a gate structure over the semiconductor fin. The gate structure includes a gate conductor and is laterally spaced from the first interlayer dielectric by a sidewall spacer.

At least the first interlayer dielectric is etched selectively with respect to the gate conductor to form a first recessed region. An etch stop layer is then formed within the first recessed region. The etch stop layer may include a conformal liner formed over the first interlayer dielectric and over sidewalls of the gate conductor, and a fill layer formed over the conformal liner.

The method further includes etching the gate conductor selectively with respect to the etch stop layer to form a second recessed region, and forming a dielectric layer over the etch stop layer and within the second recessed region. The dielectric layer is then polished to remove the overburden and expose the etch stop layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
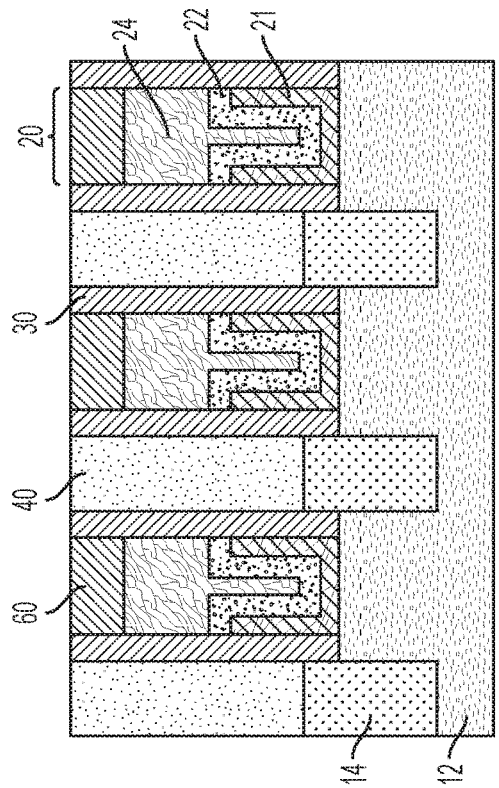
FIG. 1 is a schematic diagram of a comparative device architecture at an intermediate stage of fabrication including a gate structure formed over a semiconductor fin and a nitride capping layer formed over the gate structure and over an interlayer dielectric disposed over source/drain regions between adjacent gate structures.
Figure 2:
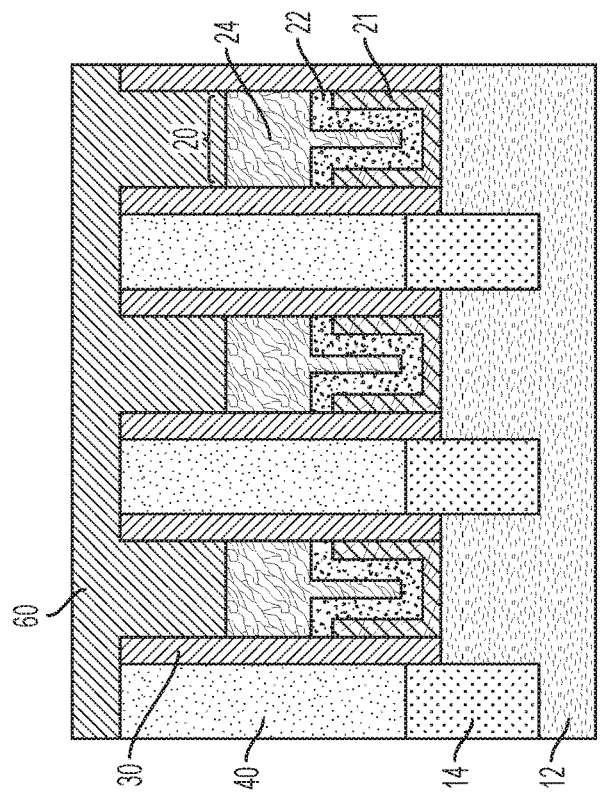
FIG. 2 shows the architecture of FIG. 1 following chemical mechanical polishing of the nitride capping layer.

Reference will now be made in greater detail to various embodiments of the subject matter of the present application, some embodiments of which are illustrated in the accompanying drawings. The same reference numerals will be used throughout the drawings to refer to the same or similar parts.

Disclosed is a method that incorporates a sacrificial etch stop layer into a self-aligned contact (SAC) CMP process. The sacrificial etch stop layer, which comprises a transition metal such as cobalt or ruthenium, enables selective polishing of a nitride layer to a specified thickness and predetermined stopping point. Polishing control of the nitride layer, which forms a capping layer over a gate metallization layer and enables subsequent selective etching of an oxide layer to form source/drain contacts, improves the robustness of the self-aligned contact process. Various methods are described herein with reference to FIGS. 3-16.

The disclosed methods may be implemented in conjunction with a gate last, or replacement metal gate (RMG) process. A typical process flow for manufacturing replacement metal gate (RMG) transistors includes forming a temporary or sacrificial gate, forming additional transistor structures, and then removing the sacrificial gate leaving a trench where various layers of material (e.g., gate dielectric and gate conductor materials) are deposited to form the functional gate. This approach delays gate formation until after processing that may otherwise damage the functional gate materials, such as exposure to elevated temperatures and/or ion implantation. As used herein, a "functional gate" refers to a structure used to control output current (i.e., the flow of carriers through a channel) of a semiconductor device using an electrical field or, in some instances, a magnetic field, and includes a gate dielectric and a gate conductor.

Figure 3:
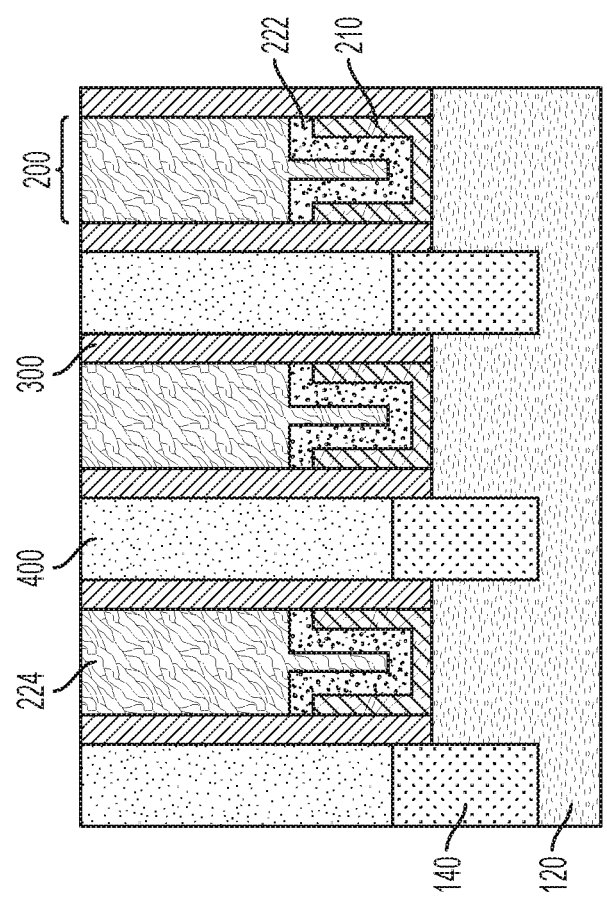
FIG. 3 is a cross-sectional schematic view of a fin field effect transistor (FinFET) architecture at an intermediate stage of fabrication following chemical mechanical polishing of a gate metallization layer to expose a first interlayer dielectric disposed over pre-formed source/drain regions and sidewall spacer layers disposed between the first interlayer dielectric and the gate metallization layer.

Referring to FIG. 3, shown is a cross-sectional schematic view of a fin field effect transistor (FinFET) architecture at an intermediate stage of fabrication following the removal of sacrificial gate structures (not shown) and their replacement with functional gate structures 200. In the illustrated embodiment, plural gate structures 200 straddle a semiconductor fin 120, i.e., over various channel regions of the fin.

In various embodiments, one or more fins 120 may be arrayed over a semiconductor substrate (not shown) and comprise a semiconductor material such as silicon. The semiconductor substrate may be a bulk substrate or a composite substrate such as a semiconductor-on-insulator (SOI) substrate that comprises, from bottom to top, a handle portion, an isolation layer, and a semiconductor material layer.

A semiconductor substrate may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The semiconductor substrate is not limited to silicon-containing materials, however, as the semiconductor substrate may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

The fins 120 may be formed by patterning and then etching the underlying semiconductor substrate, i.e., a top portion of the semiconductor substrate. In several embodiments, the fins 120 are etched from, and therefore contiguous with the semiconductor substrate. By way of example, the fins 120 may be formed using a sidewall image transfer (SIT) process, which includes formation of a spacer material on sidewall surfaces of a mandrel. The spacer includes a material that has a different etch selectivity than the mandrel such that, after spacer formation, the mandrel is removed by etching. Each spacer is then used as a hard mask during a subsequent etching process that defines the fins. The semiconductor fins 120 are typically arranged in parallel and are laterally isolated from each other by a shallow trench isolation layer (not shown).

Sidewalls spacers 300 are disposed over sidewalls (vertical surfaces) of the gate structures 200. Sidewall spacers 300 may be formed by blanket deposition of a spacer material over sacrificial gate structures, followed by a directional etch such as reactive ion etching (RIE) to remove the spacer material from horizontal surfaces.

Suitable sidewall spacer materials include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. As used herein, a low-k material has a dielectric constant less than that of silicon dioxide. In certain embodiments, the sidewall spacer 300 thickness is 4 to 20 nm, e.g., 4, 10, 15 or 20 nm, including ranges between any of the foregoing values.

Source/drain regions 140 are disposed over portions of the fins 120 proximate to top surfaces thereof. As known to those skilled in the art, source/drain regions 140 may be formed by ion implantation or selective epitaxy, optionally using sidewall spacers 300 as an alignment mask. For instance, according to various embodiments, source/drain regions 140 are formed by selective epitaxy into self-aligned cavities that are defined over the fins between the gate structures. That is, source/drain regions 140 are formed on either side of a channel region of a fin 120, which underlies a respective gate structure 200.

Source/drain regions 140 may comprise silicon (e.g., Si) or a silicon-containing material such as silicon germanium (SiGe). For instance, SiGe source/drain regions may be incorporated into a p-MOS device to provide compressive stress to the channel, which can improve carrier mobility.

A first interlayer dielectric (ILD) 400 is disposed over the source/drain regions 140. The first interlayer dielectric 400 may comprise a silicon-containing material such as $SiO_2$, SiN, $Si_3N_4$, $SiO_xN_y$, SiC, SiCO, SiCOH, and SiCH. Other suitable ILD materials include carbon-doped oxides, inorganic oxides, inorganic polymers, and organic polymers such as polyamides. The first interlayer dielectric 400 may be deposited using at least one of spinning-coating, spraying, chemical vapor deposition (CVD), plasma enhanced CVD (PECVD), sputtering, ion-beam deposition and evaporation.

As will be appreciated by those skilled in the art, gate structures 200 comprise a gate dielectric 210, a work function metal 222 and a metallization layer 224, which may be deposited in succession. The gate dielectric 210 may be a conformal layer that is formed directly over the semiconductor fin 120. The gate dielectric may comprise silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric may be deposited by a suitable process such as atomic layer deposition (ALD), chemical vapor deposition (CVD), physical vapor deposition (PVD), thermal oxidation, UV-ozone oxidation, or combinations thereof. A high-k gate dielectric thickness may range from 1 nm to 5 nm, e.g., 1, 2, 3, 4 or 5 nm, including ranges between any of the foregoing values. In various embodiments, the gate dielectric includes a thin layer (e.g., 0.5 nm) of silicon oxide and an overlying layer of high-k dielectric material.

In the illustrated embodiment, a work function metal 222 and a metallization layer 224 are formed over the gate dielectric. The work function metal 222 may comprise a conformal layer that is formed directly over the gate dielectric, and can be formed utilizing a conventional deposition process such as, for example, ALD, CVD, metalorganic chemical vapor deposition (MOCVD), molecular beam epitaxy (MBE), PVD, plating, evaporation, ion beam deposition, electron beam deposition, laser assisted deposition, or chemical solution deposition.

In various embodiments, the work function metal layer 222 may be deposited by a physical vapor deposition (PVD) method such as sputtering. Example sputtering apparatus that may be suitable for depositing the work function metal layer include DC diode type system, radio frequency (RF) sputtering, magnetron sputtering, and ionized metal plasma (IMP) sputtering.

The work function metal thickness may range from 1 nm to 8 nm, e.g., 1, 2, 3, 4, 5, 6, 7, or 8 nm, including ranges between any of the foregoing values. Example work function metals include conductive metals such as Al, Ti, Co, Cu, Mo, Ru, Rh, Ta, W, Re, Ir, Pt, Ag, and Au, alloys of conductive metals, e.g., Al—Cu, silicides of one or more conductive metals, e.g., W silicide, and Pt silicide, or other conductive metal compounds such as TiC, TiN, TiAl, TiAlN, TiSiN, TiTaN, HfN, HfSi, TaN, TaAlN, TaSiN, TaRuN, WSiN, NiSi, CoSi, as well as combinations thereof.

The material for the metallization layer 224 may be deposited to fill the space over the channel region portion of the fin between the interior sidewalls of the sidewall spacers 300. In some embodiments, and as illustrated in FIG. 3, a planarization process may be applied to the material deposited for the metallization layer 224 so that an upper surface of the metallization layer 224 is substantially coplanar with an upper surface of first interlayer dielectric 400.

Figure 4:
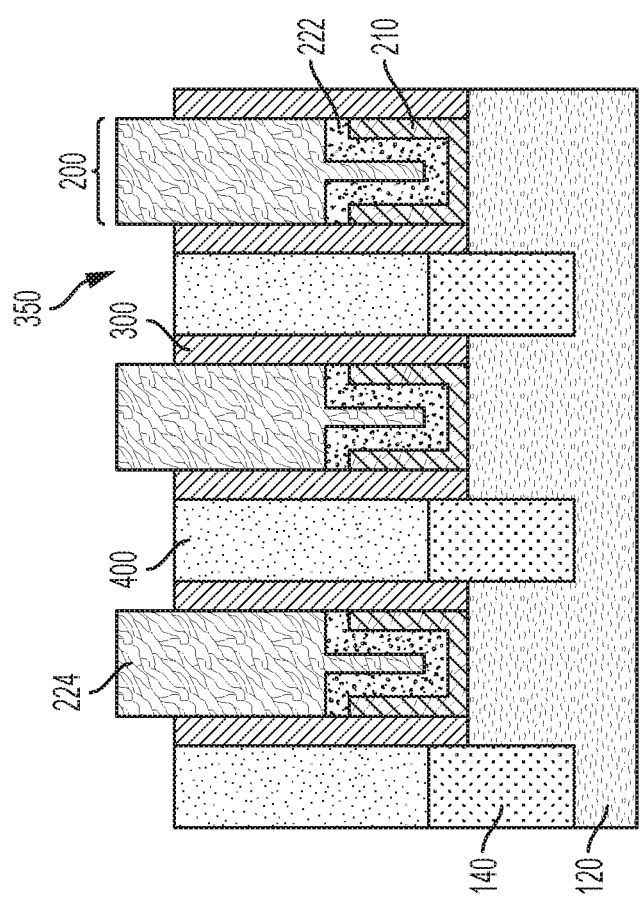
FIG. 4 shows the architecture of FIG. 3 following a selective etch of the first interlayer dielectric and sidewall spacer layers to form first recessed regions according to certain embodiments.

Following chemical mechanical polishing of the metallization layer 224 to expose top surfaces of the sidewall spacers 300 and first interlayer dielectric 400, FIG. 4 shows the architecture of FIG. 3 following a selective etch of the sidewall spacer layers 300 and first interlayer dielectric 400 to form first recessed regions 350. The recess etch exposes sidewall surfaces of the metallization layer 224, such that sidewalls of the first recessed region 350 are defined by adjacent metallization layers 224. According to certain embodiments, the recess etch may expose 20 to 80% of a height of the metallization layer 224, e.g., 20, 30, 40, 50, 60, 70 or 80%, including ranges between any of the foregoing values.

Figure 5:
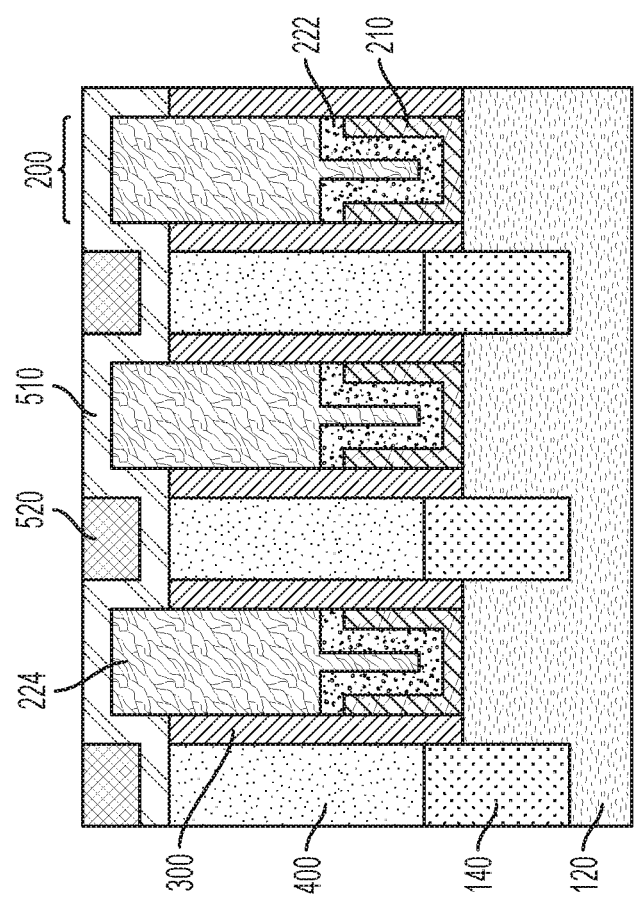
FIG. 5 shows the formation of an etch stop layer including a liner and a fill layer over the gate metallization layer and within the first recessed regions.

Referring to FIG. 5, an etch stop layer including a liner 510 and a fill layer 520 is then formed within the first recessed regions 350. Liner 510 may comprise one or more layers of tantalum, tantalum nitride, titanium, titanium nitride, tungsten nitride or tungsten carbide, and is adapted to serve as an adhesion-promoting layer for the later-formed fill layer 520. In various embodiments, the liner 510 comprises a line-of-sight deposited (PVD) or conformal (ALD/CVD) layer of titanium nitride (TiN) formed directly over top surfaces of the sidewall spacers 300 and the first interlayer dielectric 400, as well as over exposed surfaces of metallization layer 224. The thickness of the liner 510 may range from 2 nm to 10 nm, e.g., 2, 4, 6, 8 or 10 nm, including ranges between any of the foregoing values.

In various embodiments, to form the fill layer 520, a seed layer (not shown) may be initially deposited on the sidewalls and the bottom surface of liner 510 within first recessed regions 350. The seed layer may be a conformal layer having a thickness of 1 to 5 nm, e.g., 1, 2, 3, 4, or 5 nm, including ranges between any of the foregoing values. The seed layer may be formed using chemical vapor deposition (CVD), physical vapor deposition (PVD), atomic layer deposition (ALD), electroplating, electroless plating or other suitable process for creating a conformal thin film. The seed layer may comprise cobalt and, as will be appreciated by those skilled in the art, may be adapted to serve as a nucleation layer for the deposition of a fill material used to fill first recessed regions 350.

A fill layer 520 may be deposited on exposed surfaces of the seed layer, if present, or directly on exposed surfaces of the liner 510 within the first recessed regions 350 to form an etch stop layer that substantially fills the first recessed regions 350. A CMP step may then be used to remove the overburden and form a planarized structure. The fill layer 520 may comprise cobalt metal, a cobalt alloy, ruthenium metal, silicon nitride, or any other material that provides etch selectivity to both oxide and nitride materials. The fill layer 520 may be deposited by CVD, PVD, ALD, electroplating, or electroless plating, for example.

In various embodiments, fill layer 520 comprises cobalt, and may include elemental cobalt as well as alloys and mixtures that contain cobalt. In certain embodiments, the fill layer 520 and the seed layer have the same composition. In alternate embodiments, the fill layer 520 and the seed layer have different compositions. By way of example, the composition of the seed layer and the composition of fill layer 520 may be independently chosen from elemental cobalt (Co) and cobalt alloyed with up to 50 atomic percent of one or more of B, C, N, Mg, Al, Si, P, Ti, V, Cr, Mn, Fe, Ni, Cu, Zn, Ge, Zr, Nb, Mo, Ru, Rh, Pd, Ag, Hf, Ta, W, Re, Ir, Pt and Au.

Figure 6:
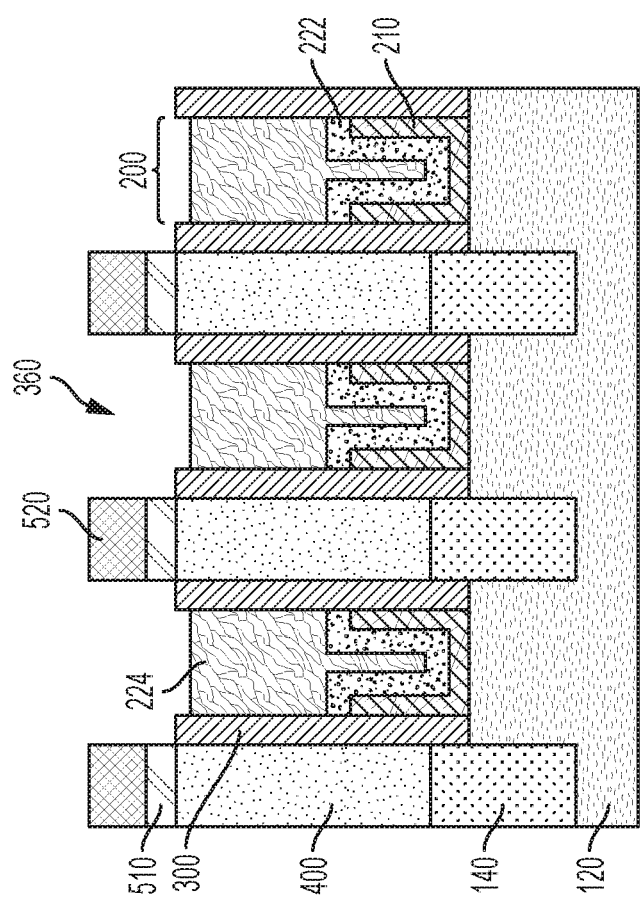
FIG. 6 depicts selective removal of portions of the gate metallization layer and portions of the liner with respect to the fill layer to form second recessed regions.

Referring to FIG. 6, an anisotropic etch is used to remove portions of the metallization layer 224 and portions of the liner 510 unblocked by the fill layer 520, i.e., selectively with respect to fill layer 520, to form second recessed regions 360. Second recessed regions 360 overlie remaining portions of the metallization layer 224 and sidewall spacers 300.

Figure 7:
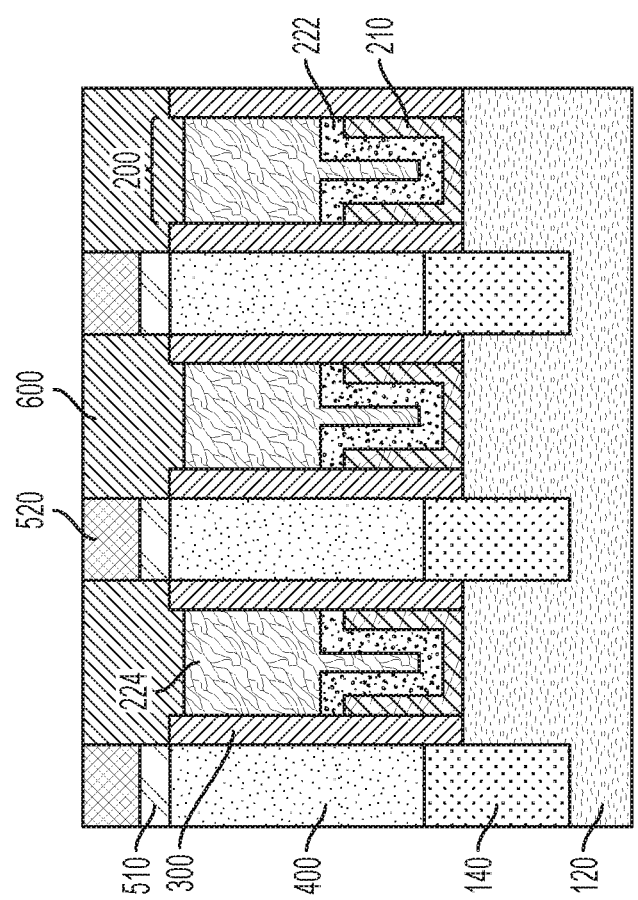
FIG. 7 shows the post-polishing deposition of a dielectric capping layer within the second recessed regions.

Then, referring to FIG. 7, a dielectric capping layer 600 is deposited over fill layer 520 and within the second recessed regions 360. The structure is polished to remove excess dielectric capping layer 600, i.e., from over fill layer 520, and expose top surfaces of the fill layer 520. The step of polishing may include planarization of the structure.

"Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Referring still to FIG. 7, the etch stop layer, including fill layer 520, provides a stopping layer for the polishing process used to remove the dielectric capping layer overburden. Thus, removal of the dielectric capping layer 600 can be controlled, and both under-polishing and over-polishing of the dielectric capping layer 600 can be avoided. According to various embodiments, a post-polish thickness of the dielectric capping layer 600 remaining over the gate structure 200 is 10 to 40 nm, e.g., 10, 20, 30 or 40 nm, including ranges between any of the foregoing values.

Figure 8:
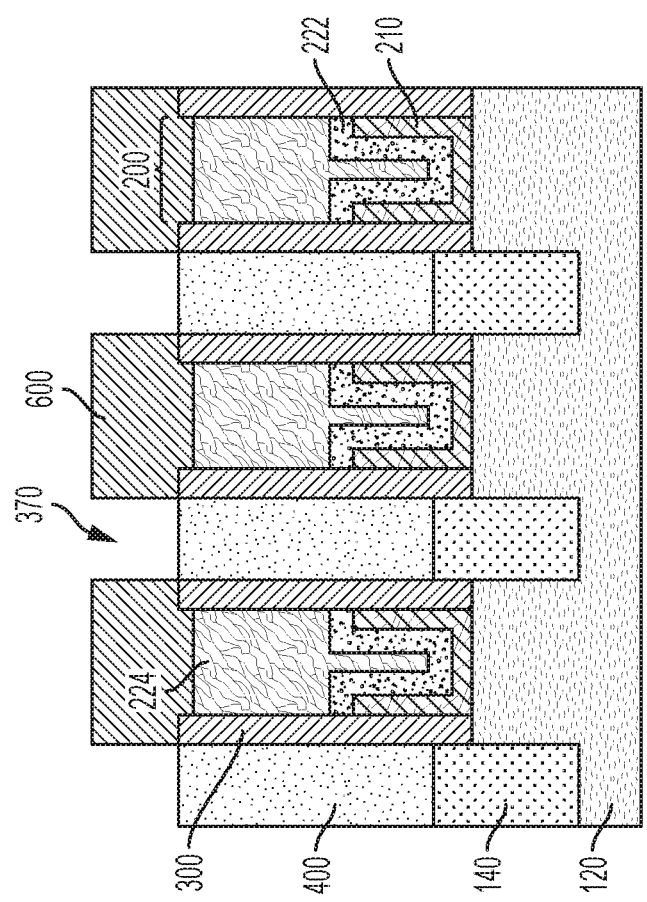
FIG. 8 depicts removal of remaining portions of the etch stop layer to form third recessed regions over the first interlayer dielectric.

Referring to FIG. 8, a selective etching process is used to remove remaining portions of the etch stop layer, including remaining portions of liner 510 and fill layer 520, and form third recessed regions 370. The etch stop layer may be removed selectively with respect to dielectric capping layer 600. In the illustrated embodiment, the third recessed regions 370 directly overlie first interlayer dielectric 400, and sidewalls of the third recessed regions 370 are co-planar with sidewalls of the first interlayer dielectric 400.

Figure 9:
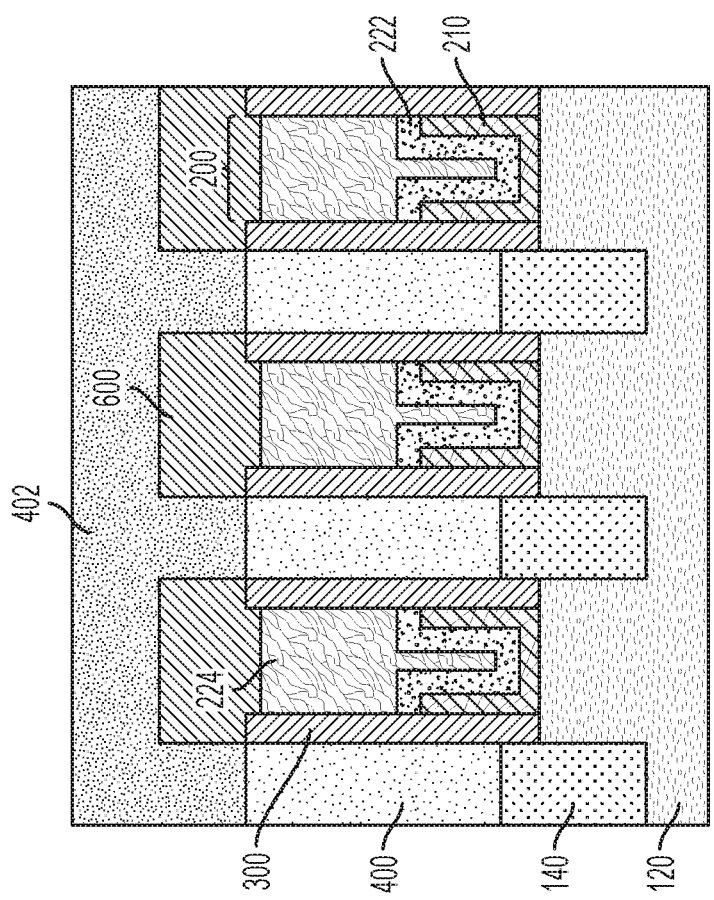
FIG. 9 shows the deposition of a second interlayer dielectric within the third recessed regions and directly over the first interlayer dielectric.

Referring to FIG. 9, according to various embodiments, a second interlayer dielectric 402 is deposited within third recessed regions 370 and directly over first interlayer dielectric 400.

As will be appreciated, the etch stop layer is adapted to function as a stopping layer for polishing of the nitride capping layer 600. In the foregoing embodiment, the etch stop layer, including liner 510 and fill layer 520, is incorporated into the device structure within first recessed regions 350, i.e., over the first interlayer dielectric 400 and sidewall spacer layers 300, by recessing the first interlayer dielectric 400 and sidewall spacer layers 300 with respect to the metallization layer 224.

Figure 10:
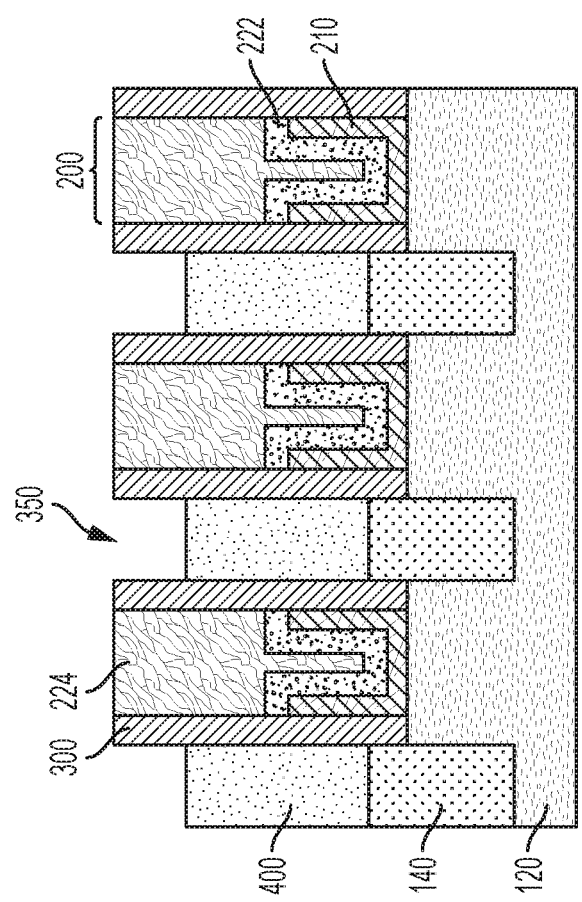
FIG. 10 shows the architecture of FIG. 3 following a selective etch of the first interlayer dielectric to form first recessed regions according to certain embodiments.

A further embodiment is described with particular reference to FIGS. 10-16. Referring to FIG. 10, following chemical mechanical polishing of the metallization layer 224 to expose top surfaces of the sidewall spacers 300 and first interlayer dielectric 400, a selective etch is used to recess the first interlayer dielectric 400 to form first recessed regions 350. The exemplary structure of FIG. 10 is analogous to the structure of FIG. 4, except that in the process depicted in FIG. 10, the recess etch is selective to the sidewall spacers 300, such that sidewall spacers 300 are retained and define the sidewalls of the first recessed region 350.

Figure 11:
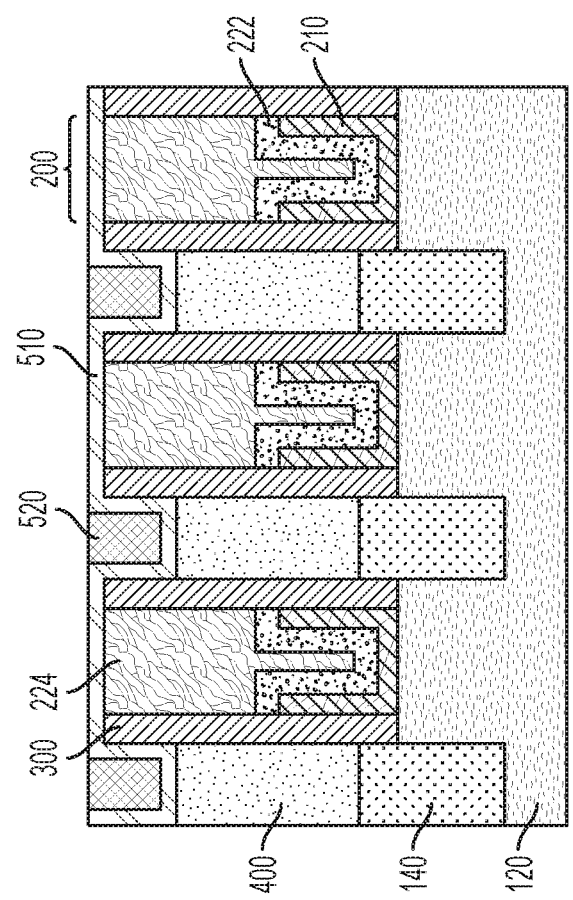
FIG. 11 shows the formation of an etch stop layer including a liner and a fill layer over the gate metallization layer and within the first recessed regions.
Figure 12:
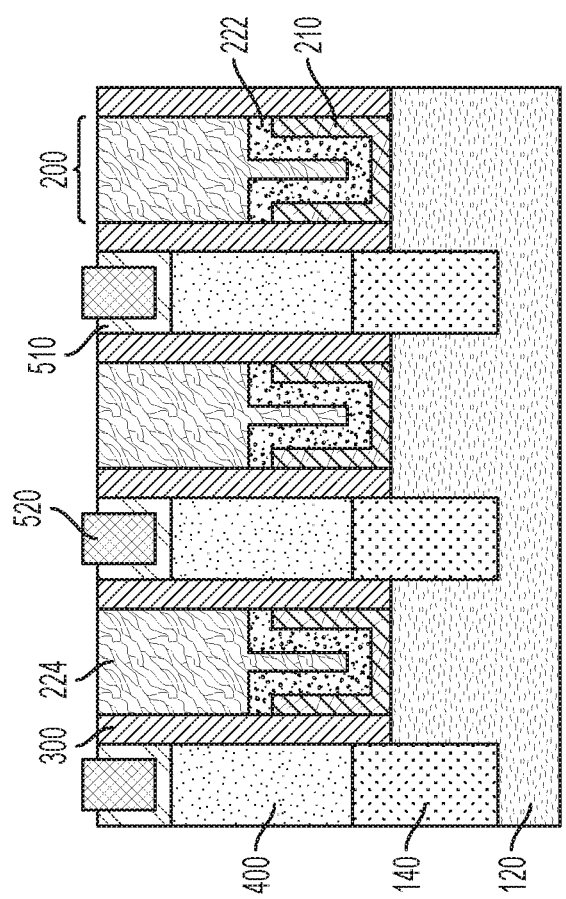
FIG. 12 shows an etching step to remove the etch stop liner from over the gate metallization layer and sidewall spacers.

Referring to FIG. 11, an etch stop layer including a liner 510 and a fill layer 520 is formed within the first recessed regions 350. The methods and materials described above may be used to form the etch stop layer. The liner 510 and fill layer 520 may be formed in succession and a polishing step may be used to remove the overburden and form the structure shown in FIG. 11. In the illustrated embodiment, the fill layer 520 functions as a CMP stop and a portion of the liner 510 is initially retained over top surfaces of the metallization layer 224 and sidewall spacers 300. Referring to FIG. 12, a selective etch may be used to remove the liner 510 from over the metallization layer 224 and sidewall spacers 300.

Figure 13:
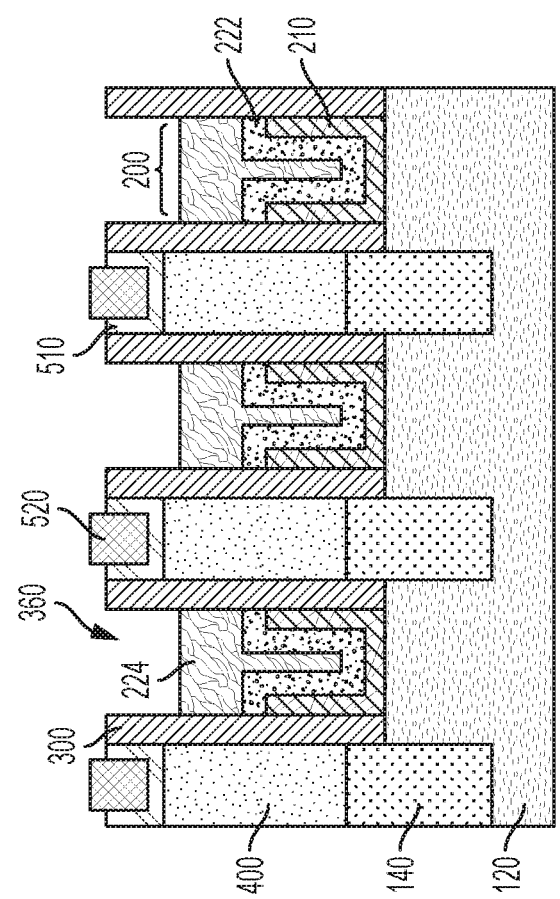
FIG. 13 depicts a recess etch of the gate metallization layer selective to the etch stop layer and sidewall spacers to form second recessed regions.
Figure 14:
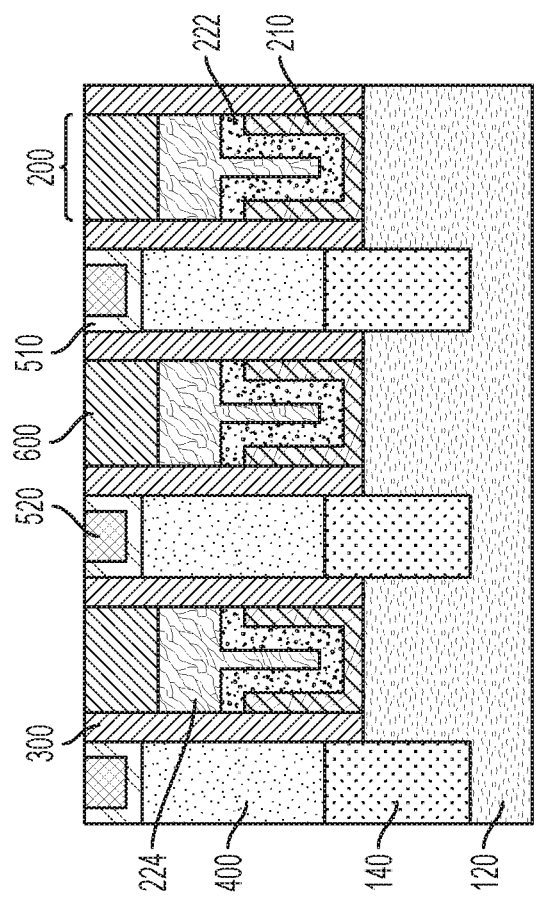
FIG. 14 shows the deposition and polishing of a dielectric capping layer within the second recessed regions.

Referring to FIG. 13, a second recessed region 360 is formed by etching exposed portions of the metallization layer 224. The metallization layer 224 may be etched selectively with respect to sidewalls spacers 300 and etch stop layer, including fill layer 520. In the present embodiment, the second recessed regions 360 overlie remaining portions of the metallization layer 224 and are bounded laterally by sidewall spacers 300. Then, referring to FIG. 14, a dielectric capping layer 600 is deposited within the second recessed regions 360. The structure is polished to remove excess dielectric capping layer 600 and expose top surfaces of the fill layer 520, where during polishing the fill layer 520 serves as a stopping layer. According to various embodiments, a post-polish thickness of the dielectric capping layer 600 remaining over the gate structure 200 is 10 to 40 nm, e.g., 10, 20, 30 or 40 nm, including ranges between any of the foregoing values.

Figure 15:
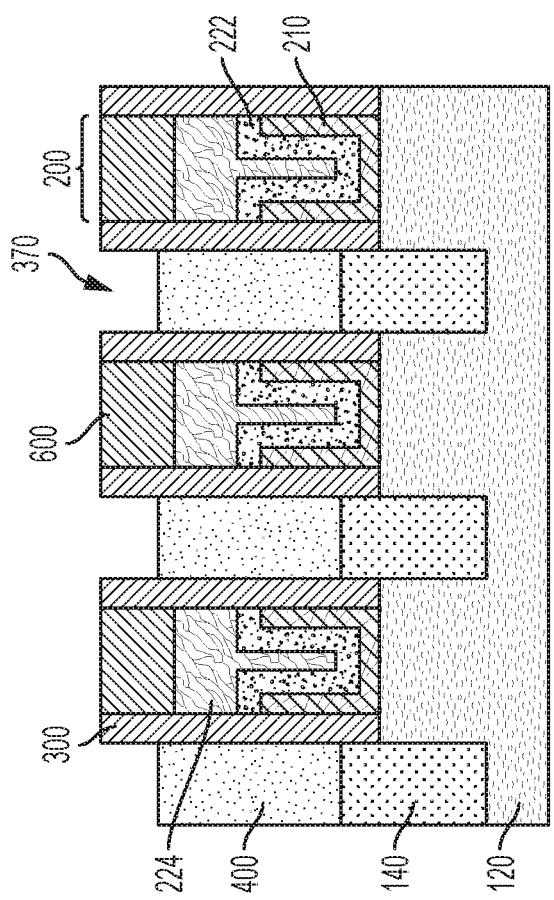
FIG. 15 depicts removal of remaining portions of the etch stop layer to form third recessed regions over the first interlayer dielectric.
Figure 16:
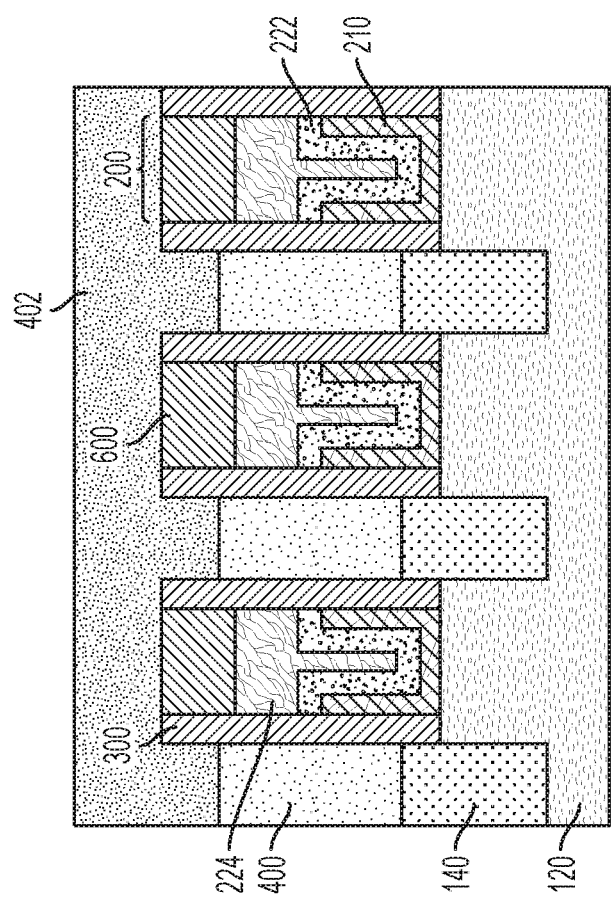
FIG. 16 shows the deposition of a second interlayer dielectric within the third recessed regions and directly over the first interlayer dielectric.

Referring to FIG. 15, a selective etching process is used to remove remaining portions of the etch stop layer, including remaining portions of liner 510 and fill layer 520, and form third recessed regions 370. The etch stop layer may be removed selectively with respect to sidewall spacers 300 and dielectric capping layer 600. In the illustrated embodiment, the third recessed regions 370 directly overlie first interlayer dielectric 400. Referring to FIG. 16, a second interlayer dielectric 402 is deposited within third recessed regions 370 and directly over first interlayer dielectric 400.

Embodiments of the disclosed method relate to the formation of a semiconductor device. In an exemplary method, source/drain regions are formed over a semiconductor fin and a first interlayer dielectric is formed over the source/drain regions. A functional gate structure including a gate dielectric and a gate conductor is formed over the semiconductor fin, and is laterally spaced from the first interlayer dielectric by a sidewall spacer. The method further includes etching the first interlayer dielectric selectively with respect to the gate conductor to form a first recessed region.

An etch stop layer is then formed within the first recessed region. The etch stop layer may comprise a conformal liner formed over the first interlayer dielectric and over sidewalls of the gate conductor and a fill layer formed over the conformal liner. Using the etch stop layer as an etch mask, the gate conductor is etched selectively to form a second recessed region. A dielectric capping layer is then formed within the second recessed region, and remaining portions of the etch stop layer may be removed and backfilled with a second interlayer dielectric.

As used herein, the singular forms "a," "an" and "the" include plural referents unless the context clearly dictates otherwise. Thus, for example, reference to a "gate conductor" includes examples having two or more such "gate conductors" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a gate dielectric that comprises hafnium oxide include embodiments where a gate dielectric consists essentially of hafnium oxide and embodiments where a gate dielectric consists of hafnium oxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a device, comprising:
   forming a source/drain region on a semiconductor fin;
   forming a first interlayer dielectric over the source/drain region;
   forming a gate structure over a channel region of the semiconductor fin, the gate structure laterally spaced from the first interlayer dielectric and the source/drain region by a sidewall spacer and comprising a gate dielectric formed directly over the channel region and a gate conductor formed over the gate dielectric;
   etching at least the first interlayer dielectric selectively with respect to the gate conductor to form a first recessed region;
   forming an etch stop layer within the first recessed region;
   etching the gate conductor selectively with respect to the etch stop layer to form a second recessed region;
   forming a dielectric layer over the etch stop layer and within the second recessed region;
   polishing the dielectric layer to expose the etch stop layer;
   removing the etch stop layer to form a third recessed region; and
   forming a second interlayer dielectric within the third recessed region and directly over the first interlayer dielectric.

2. The method of claim 1, wherein forming the etch stop layer comprises forming a conformal liner within the first recessed region and forming a fill layer over the conformal liner.

3. The method of claim 2, further comprising polishing the fill layer to expose a top surface of the conformal liner.

4. The method of claim 2, wherein the conformal liner comprises titanium nitride and the fill layer comprises cobalt.

5. The method of claim 2, wherein forming the second recessed region further comprises etching a portion of the conformal liner.

6. The method of claim 1, wherein the dielectric layer is formed directly over a top surface of the gate conductor.

7. The method of claim 1, wherein the etching to form the first recessed region further comprises etching the sidewall spacer.

8. The method of claim 7, wherein the dielectric layer is formed directly over a top surface of the gate conductor and directly over a top surface of the sidewall spacer.

9. The method of claim 1, wherein polishing the dielectric layer comprises exposing a top surface of the etch stop layer.

10. The method of claim 1, wherein after polishing the dielectric layer and exposing the etch stop layer, the dielectric layer thickness ranges from 10 to 40 nm.

11. The method of claim 1, wherein the first interlayer dielectric and the second interlayer dielectric each comprise silicon dioxide.

12. The method of claim 1, wherein a width of the third recessed region is substantially equal to a width of the first interlayer dielectric.

13. A method of forming a device, comprising:
   forming a source/drain region on a semiconductor fin;
   forming a first interlayer dielectric over the source/drain region;
   forming a gate structure over the semiconductor fin, wherein the gate structure includes a gate conductor and is laterally spaced from the first interlayer dielectric by a sidewall spacer;
   etching at least the first interlayer dielectric selectively with respect to the gate conductor to form a first recessed region;
   forming an etch stop layer within the first recessed region, wherein the etch stop layer comprises a conformal liner formed over the first interlayer dielectric and over sidewalls of the gate conductor and a fill layer formed over the conformal liner;
   etching the gate conductor selectively with respect to the etch stop layer to form a second recessed region;

forming a dielectric layer over the etch stop layer and within the second recessed region; and polishing the dielectric layer to expose the etch stop layer.

14. The method of claim 13, further comprising:

removing the etch stop layer to form a third recessed region; and forming a second interlayer dielectric within the third recessed region and directly over the first interlayer dielectric.

15. The method of claim 13, wherein the dielectric layer is formed directly over a top surface of the gate conductor.

16. The method of claim 13, wherein forming the first recessed region further comprises etching the sidewall spacer.

17. The method of claim 16, wherein the dielectric layer is formed directly over a top surface of the gate conductor and directly over a top surface of the sidewall spacer.

18. The method of claim 13, wherein the conformal liner comprises titanium nitride and the fill layer comprises cobalt.

\* \* \* \* \*